United States Patent
Tung et al.

(10) Patent No.: US 7,342,823 B2
(45) Date of Patent: Mar. 11, 2008

(54) TUNNELING MAGNETORESISTANCE DEVICE WITH HIGH MAGNETOIMPEDANCE (MI) EFFECT

(75) Inventors: Mean-Jue Tung, Hsinchu (TW); Shi-Yuan Tong, Hsinchu (TW); Minn-Tsong Lin, Hsinchu (TW); Yin-Ming Chang, Hsinchu (TW); Kai-Shin Li, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 414 days.

(21) Appl. No.: 11/189,867

(22) Filed: Jul. 27, 2005

(65) Prior Publication Data

US 2006/0138505 A1 Jun. 29, 2006

(30) Foreign Application Priority Data

Dec. 29, 2004 (TW) .............................. 93141238 A

(51) Int. Cl.
*G11C 11/00* (2006.01)
(52) U.S. Cl. .................... 365/158; 365/171; 365/173
(58) Field of Classification Search ................ 365/158, 365/171, 173
See application file for complete search history.

(56) References Cited

U.S. PATENT DOCUMENTS

| 6,219,274 B1 * | 4/2001 | Shimazawa et al. ........ 365/158 |
| 6,657,830 B2 | 12/2003 | Ito et al. |
| 2006/0125034 A1 * | 6/2006 | Ohba et al. ................. 257/421 |

FOREIGN PATENT DOCUMENTS

| JP | 09-198622 A | 7/1997 |
| JP | 2002-025017 A | 1/2002 |

* cited by examiner

*Primary Examiner*—Pho M. Luu
(74) *Attorney, Agent, or Firm*—Birch, Stewart, Kolasch & Birch, LLP

(57) ABSTRACT

A tunneling magnetoresistance device with high magnetoimpedance effect, a first ferromagnetic layer, a second ferromagnetic layer, and a tunnel barrier layer which is located between the first ferromagnetic layer and the second ferromagnetic layer. Wherein an alternating current is applied to the tunneling magnetoresistance device, the tunneling magnetoresistance device has at least 100% variation of real components between an applied first alternating frequency and an applied second alternating frequency, at least 25% variation of imaginary components below the first alternating frequency, and at least 8.5% variation of magneto capacitance (MC) ratio which are generated along the magnetization direction.

20 Claims, 4 Drawing Sheets

TUNNELING MAGNETORESISTANCE DEVICE WITH HIGH MAGNETOIMPEDANCE (MI) EFFECT

BACKGROUND

1. Field of Invention

The invention relates to the tunneling magnetoresistance device and, in particular, to the tunneling magnetoresistance device possessing a high magnetoimpedance (MI) effect.

2. Related Art

Magnetic random access memory (MRAM) and magnetic detector have considered as the most potential and applicable devices with high magnetoresistance ratio due to the peculiar interface characteristic between the magnetic layers, indicating the phenomenon of high resistance variations ($\Delta R/R$) have increased record density of commercial hard disk up to 150 Gb/in$^2$, and made the read-out ability of tunneling magnetoresistance device higher than that of the spin valve. Thus, the spotlights of spin research were focused on how to improve on the $\Delta R/R$ variation and find total solutions by adjusting the different composition and arrangement between stacking magnetic multi-layers. For instance, an anti-ferromagnetic coupled (AFC) inserting layer is used to increase the $\Delta R/R$ variation for 30 to 40%. Further study about sensitivity and reproduction characteristic is another important topic in the field of spin electronic devices. For this reason, most researchers are trying to improve on the higher MR ratio efficiently. These methods were used to try changing the film structure of the intermediate insulation layer, and looking for the semi-mental material as magnetic inserting layer that has near 100% spin-polarization (SP). However, highest MR ratios were presently obtained only about 30~40% and the reproduction of structure and characteristic are not good enough.

For instance, U.S. Pat. No. 6,657,830 discloses a spin valve structure that use stacking magnetic layers of different composition or semi-metal materials with high spin polarization to compose soft ferromagnetic layers and ferromagnetic layers. The CPP measurements were carried out at normal temperature with bias voltage of ±0.2V. As shown in FIG. 1, the drawing shows a highly asymmetric MR curve and a little smaller $\Delta R/R$ ratio with applied positive bias voltage. This method improves poor stability of the conventional MR detector. With reference to FIG. 2, U.S. Pat. No. 6,219,274 discloses three-layer structures that are composed of a first ferromagnetic layer 1, a tunnel barrier layer 3, and a second ferromagnetic layer 5. According to the U.S. Pat. No. 6,219,274, a radical oxidation process was used to make MR devices high reproduction and stability. However, only 13% of $\Delta R/R$ variation can be obtained after adjusting optimal processes. Please refer to FIG. 3. Japan patent JP2002-025017 discloses a structure that inserts an MR device between an upper shield electrode 7 and a lower shield electrode 9. The patent also studies signal to noise (S/N) ratio with relations to driving frequency of current and R×A ratio, but this patent doesn't disclose the detailed relationship between frequency of alternating current and resistance/impedance of the MR device. Further, this patent also doesn't mention in depth about real component (MRe) and imaginary component (MIm) of magnetoimpedance after complex number conversions. In another Japan patent JP H09-198622, a ferrimagnetic layer is used to replace one ferromagnetic layer of the three-layer structure and study the MR property. However, this patent only provides B-H relation drawing, and no figures about the MR curve.

According to the descriptions above, they all mention how to use MR characteristics for the read-out device but the best value of the MR value was obtained only about 30%~40%. Therefore, it is necessary to research further more about how to improve the MR value.

SUMMARY

In virtue of the reasons above, one objective of this invention is to provide a tunneling magnetoresistance device with high magnetoimpedance effect, utilizing the impedance characteristics of MRe and MIm components that respond to an alternating characterized frequency. This unique character can be applied for magnetic detector to reduce the driving current of read-out and improve on the better sensitivity.

For the sake of achieving the objective above, a tunneling magnetoresistance device with high magnetoimpedance effect includes: a first ferromagnetic layer; a second ferromagnetic layer; a tunnel barrier layer which is located between the first ferromagnetic layer and the second ferromagnetic layer. When a alternating current is applied to the tunneling magneto resistance device, the tunneling magnetoresistance device shows at least 100% impedance characteristic of a real component between the first alternating frequency and second alternating frequency, at least 25% impedance characteristic of an imaginary component below the first alternating frequency, and at least 8.5% capacitance variation of tunnel barrier interface which is produced along the magnetization direction under applied fields.

The first alternating frequency could be 1 KHz or 100 KHz and the second alternating frequency could be 10000 KHz. The impedance characteristic of an imaginary component between alternating frequency of 0.005 KHz and alternating frequency of 50 KHz could be larger than 40%.

The coercive force (Hc) of the second ferromagnetic layer could be larger than that of the first ferromagnetic layer. For example, the coercive force (Hc) of the first ferromagnetic layer could be smaller than 500 Oe and the coercive force (Hc) of the second ferromagnetic layer could be larger than 25 Oe.

In addition, the second ferromagnetic layer could further stack with anti-ferromagnetic layer to enhance overall magnetization direction of the second ferromagnetic layer.

Besides, a pair of outside electrode stretched out for the first ferromagnetic layer and second ferromagnetic layer to pass the source of an alternating current.

DETAILED DESCRIPTION

Technical feature of this invention is to provide a tunneling magnetoresistance (TMR) device possessing magnetoimpedance properties of real component (MRe) and imaginary component (MIm). Real component (MRe) and imaginary component (MIm) can be obtained by complex number transformation of impedance in the process of responding to an alternating current.

According to magnetoimpedance (MI) characteristic of TMR device in responding to an alternating current with high frequency, magnetoimpedance can be divided into high ratio of real components (MRe) at a specific frequency and high ratio of imaginary components (MIm) at low frequency after complex number transformation. This characteristic is very helpful to improve on sensitivity of TMR device.

Record bits of magnetic memory device generate an alternating polarization within magnetic field while different polarization of alternating signal is transiently passing through in the nano-second of reading/writing processes. Therefore the signal output of impedance for magnetoresistance device is related to frequency of alternating current.

Thus, this invention provides a tunneling magneto resistance device which composed of interposing ultra thin layer possessing high dielectric property or an anti-ferromagnetic coupled (AFC) layer inserting between two magnetic layers. The variation of magnetic impedance was carried out measuring in the applied field.

Figure 1:
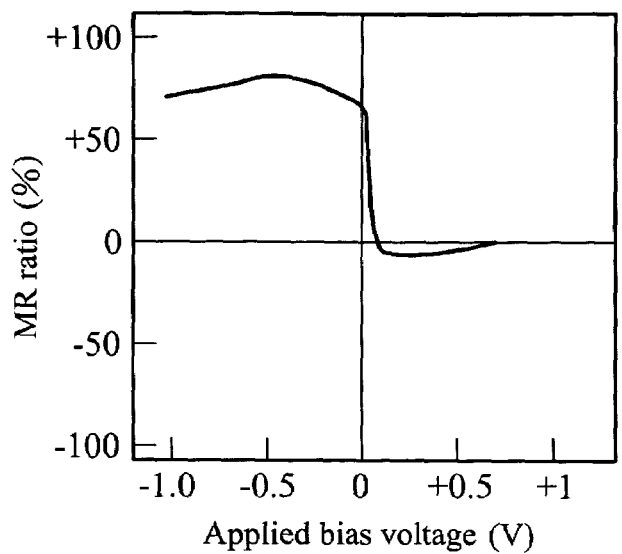
FIG. 1 is a schematic of MR response for spin valve structure with reference to U.S. Pat. No. 6,657,830.
Figure 2:
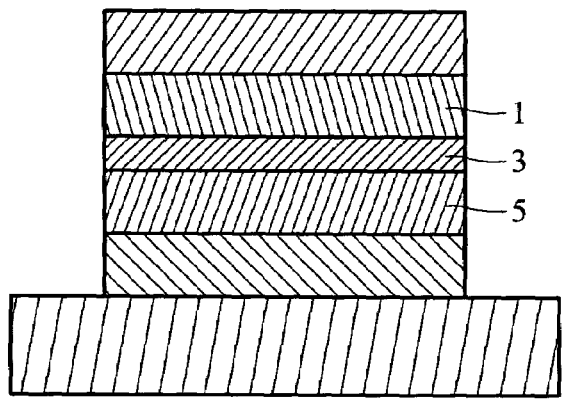
FIG. 2 is a schematic of MR structure with reference to U.S. Pat. No. 6,219,274.
Figure 3:
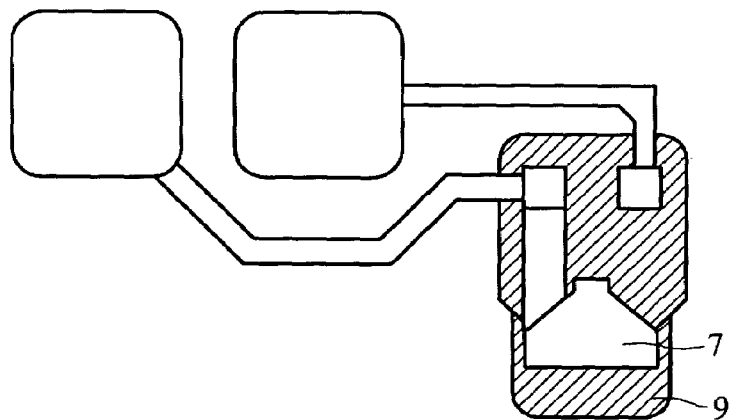
FIG. 3 is a schematic of MR device between top and bottom electrodes with reference to Japan patent 2002-025017.
Figure 4:
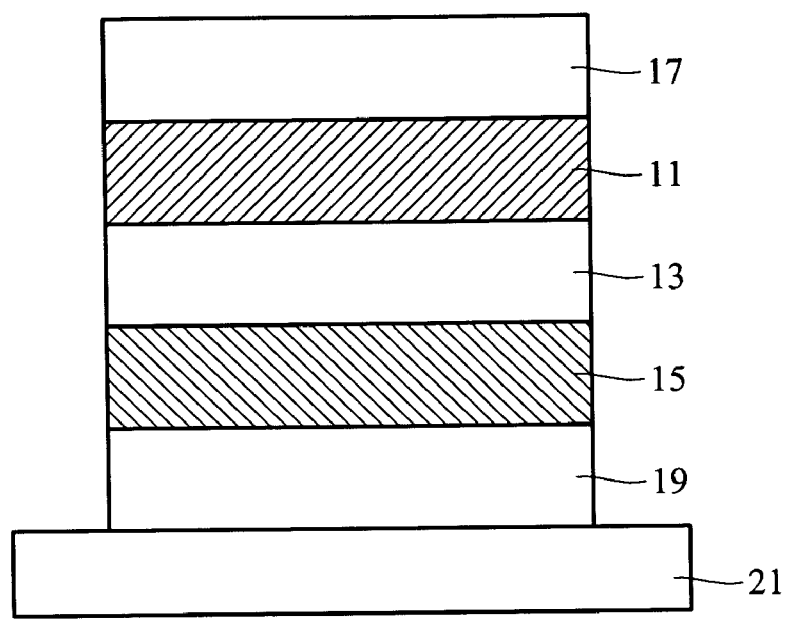
FIG. 4 is a schematic of the preferred embodiment according to the invention.

A preferred embodiment of this device is shown in FIG. 4.

In this preferred embodiment, a multilayer device with a tunneling magneto resistance property is disclosed. The multilayer device comprises a first ferromagnetic layer 11, a second ferromagnetic layer 15, and a tunnel barrier layer 13 which is interposed between the first ferromagnetic layer 11 and second ferromagnetic layer 15.

This device comprises a pair of electrodes 17, 19. The first electrode 17 and the second electrode 19 are the outsides of the first ferromagnetic layer 11 and second ferromagnetic layer 15, respectively for passing the current through the multilayer structure. As shown in FIG. 4, the second electrode 19, the second ferromagnetic layer 15, the tunnel barrier layer 13, the first ferromagnetic layer 11 and the first electrode 17 can consecutively be formed on the substrate 21.

The first ferromagnetic layer 11 functions as a free layer which magnetization direction can be changed easily without any restriction in the sweep of applied magnetic filed. The second ferromagnetic layer 15 functions as a pinning layer whose magnetization direction cannot be changed in the sweep of applied magnetic filed. The magnetization direction of the first ferromagnetic layer 11 can be changed by magnetic induction field when applying a driving current through the electrodes above. When magnetizations of two ferromagnetic layers 11,15 show parallel direction, conduction electrons can easily pass through intermediate barrier layer, transmission interface shows a status of low equivalent resistance. On the other hand, when magnetizations of two ferromagnetic layers 11,15 show anti-parallel direction, it is very difficult for conduction electrons to pass through intermediate barrier layer and the transmission interface shows a status of high equivalent resistance. This outstanding property described above can be used to read/write and storage data. This MR device has advantages, such as voltage reduction, nano-second R/W process and near infinite R/W times.

Except for main components described above, an anti-ferromagnetic layer could be further located (not shown in the drawing) between the second ferromagnetic layer 15 and second electrode 19 to strengthen magnetic moment of the second ferromagnetic layer 15. The coercive force (Hc) of the second ferromagnetic layer 15 becomes larger than that of anti-ferromagnetic layer. On the other hand, the first ferromagnetic layer 11 and the second ferromagnetic layer 15 could be exchanged. (The first ferromagnetic layer 11 functions as a pinning layer and the second ferromagnetic layer 15 functions as a free layer). The anti-ferromagnetic layer can be inserted between the first ferromagnetic layer 11 and first electrode 17.

The anti-ferromagnetic layer can be composed of anti-ferromagnetic material, such as Co, Fe, Ni, Mn, Pt, Ir, a compound or a combination with at least one of the above elements.

In this preferred embodiment, the first ferromagnetic layer 11 can be composed of softer magnetic material with smaller coercive force than the second ferromagnetic layer 15. A softer magnetic material shows a weaker coercive force which can be lower than 50 Oe.

The second ferromagnetic layer 15 can be composed of harder magnetic material with larger coercive force than the first ferromagnetic layer 11. A harder magnetic material shows a stronger coercive force which can be larger than 25 Oe.

The first ferromagnetic layer 11 and second ferromagnetic layer 15 comprised more than one layer. Both of them also comprised a couple of anti-ferromagnetic layers or multilayer structure of a non-magnetic layer interposed between two ferromagnetic layers 11 and 15, such as a CoFe/Ru/CoFe structure.

The first ferromagnetic layer 11 comprised Co, Fe, Ni, Gd, Ru, B, or a combination with at least one of the above elements. The preferable material is Co, Fe, or Ni. The second ferromagnetic layer 15 comprised Co, Fe, Ni, Gd, Ru, B, or a combination with at least one of the above elements. The preferable material is Co, Fe, or Ni.

In addition, the tunnel barrier layer comprised a metal oxide, a metal nitride, a silicon oxide, or a combination with at least one of the compounds above.

The metal oxide can be a cobalt oxide, an iron oxide, a nickel oxide, a manganese oxide, zinc oxide, an aluminum oxide, a lead oxide, a tantalum oxide, a magnesium oxide, a barium oxide, a zirconium oxide, a titanium oxide, a strontium oxide, a copper oxide, a chromium oxide, a lithium oxide, a tin oxide, a hafnium oxide or a combination with at least one of the compounds above.

The metal nitride can be a cobalt nitride, an iron nitride, a nickel nitride, a manganese nitride, a zinc nitride, an aluminum nitride, a lead nitride, a tantalum nitride, a magnesium nitride, a barium nitride, a zirconium nitride, a titanium nitride, a strontium nitride, a copper nitride, a chromium nitride, a lithium nitride, a tin nitride, a hafnium nitride or a combination with at least one of the compounds above.

Figure 5:
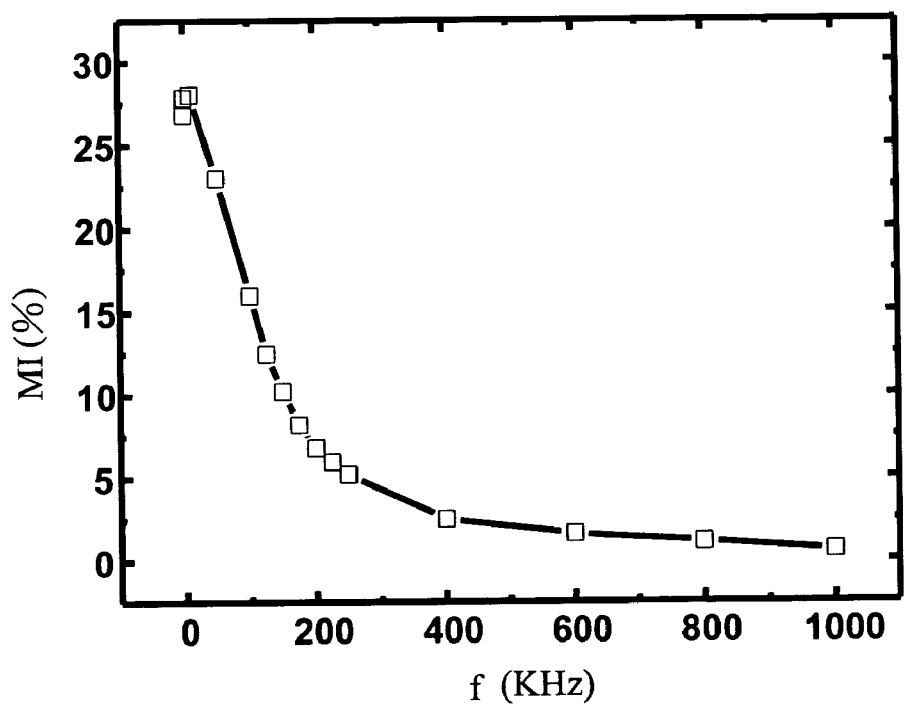
FIG. 5 is a schematic of MI response for the device when an alternating current passes according to the invention.
Figure 6:
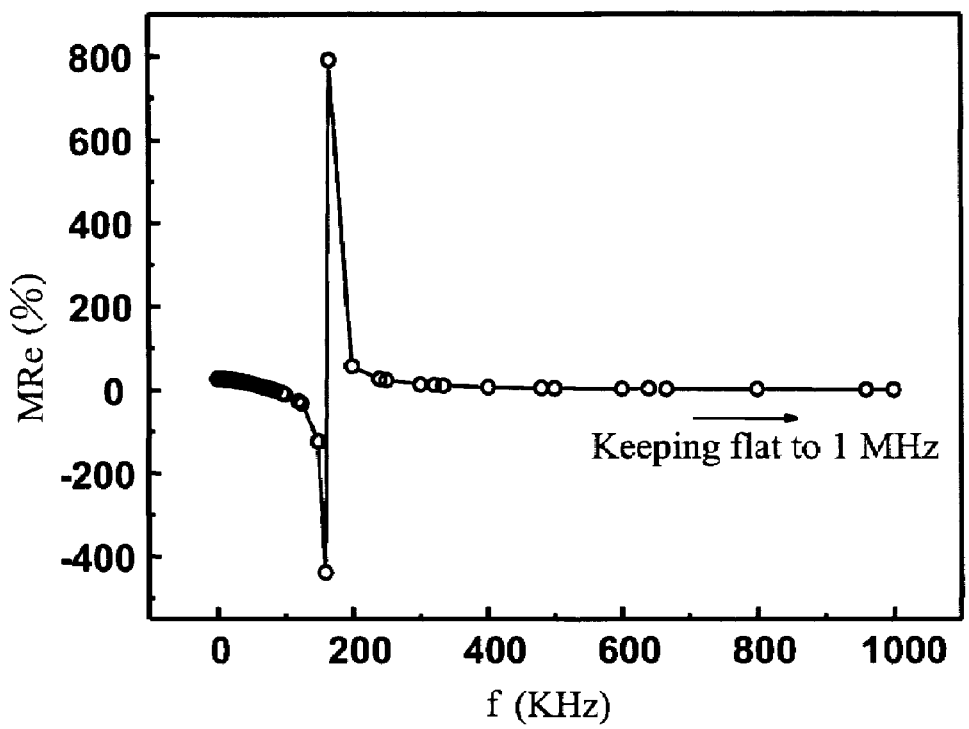
FIG. 6 is a schematic of MRe response for the device when an alternating current passes according to the invention.

The quintessence of this invention is MI response in the applied alternating current with different driving frequency, as shown in FIG. 5. With reference to FIG. 6, alternating impedance can be divided into a real component and an imaginary component after complex number transformation.

Figure 7:
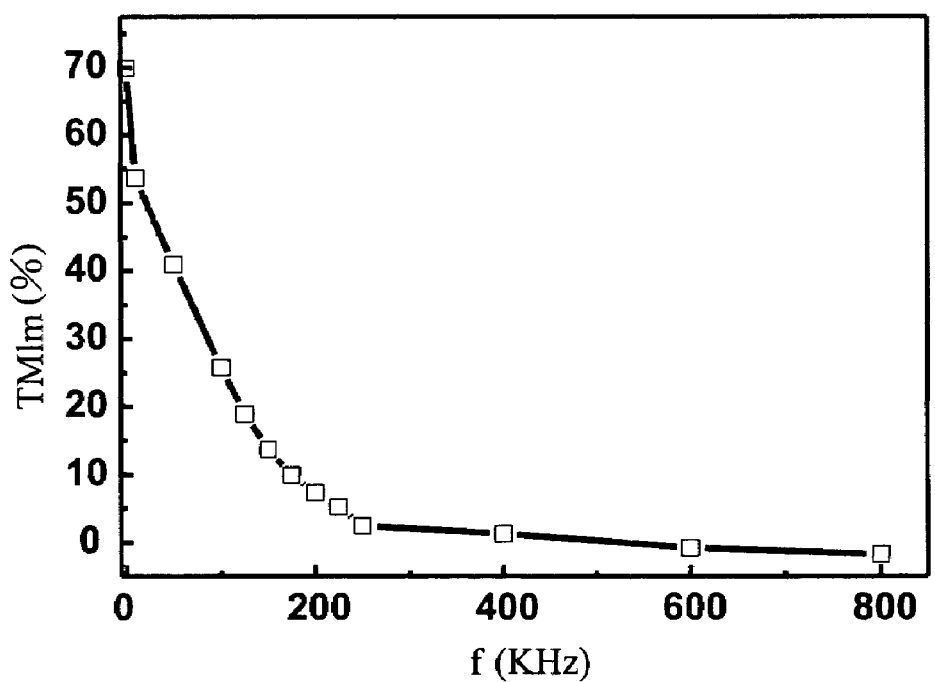
FIG. 7 is a schematic of MIm response for the device when an alternating current passes according to the invention.
Figure 8:
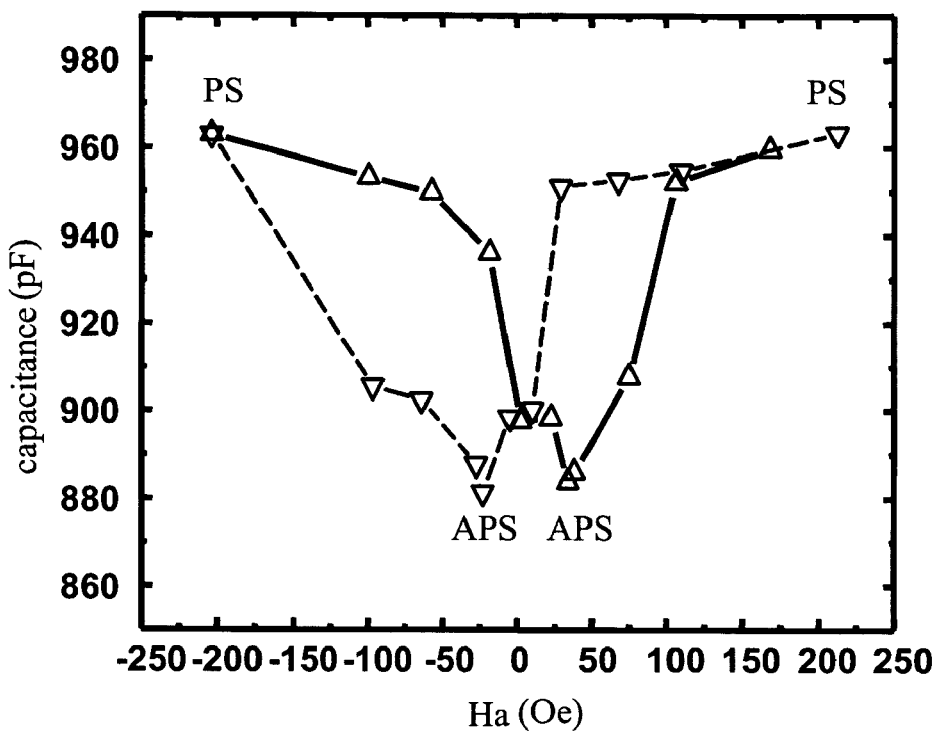
FIG. 8 is a schematic of a magnetocapacitance response for the device in the applied magnetic field according to the invention.

The results show that the value of the magnetic real component reach up to $10^{-5}\Omega$ in the range of characteristic frequency ($f_c$) between 1 KHz and 10 MHz when magnetic configuration shows parallel spin-state. The variation of real components (MRe) exceeds more than 100% in the characteristic frequency ($f_c$). The schematic shows the variation of MRe component up to 800%. The results of MRe variation obviously show much higher than that of conventional MR property. As shown in FIG. 7, the variations of imaginary component (MIm) reach up to 70% in the low frequency and also much higher than that of conventional MR device. As shown in FIG. 8, the variations of magneticapacitance (MC) effect along the magnetization direction reach up to 8.5% by analysis of equivalent magnetic impedance circuit.

Therefore advantages such as the output voltage of S/N ratio, reduction of the reading driving current and high sensitivity of the detector can be accomplished by applying this property of magnetoimppedance (MI) to magnetic detector.

The electrodes 17, 19 in the invention are used to pass through alternating current in this preferred embodiment. Practically, the MR device only directly uses the first ferromagnetic layer 11 and second ferromagnetic layer 15 without the electrodes 17 and 19 to pass through the alternating current, showing similar MI property for detector application.

Figure 9:
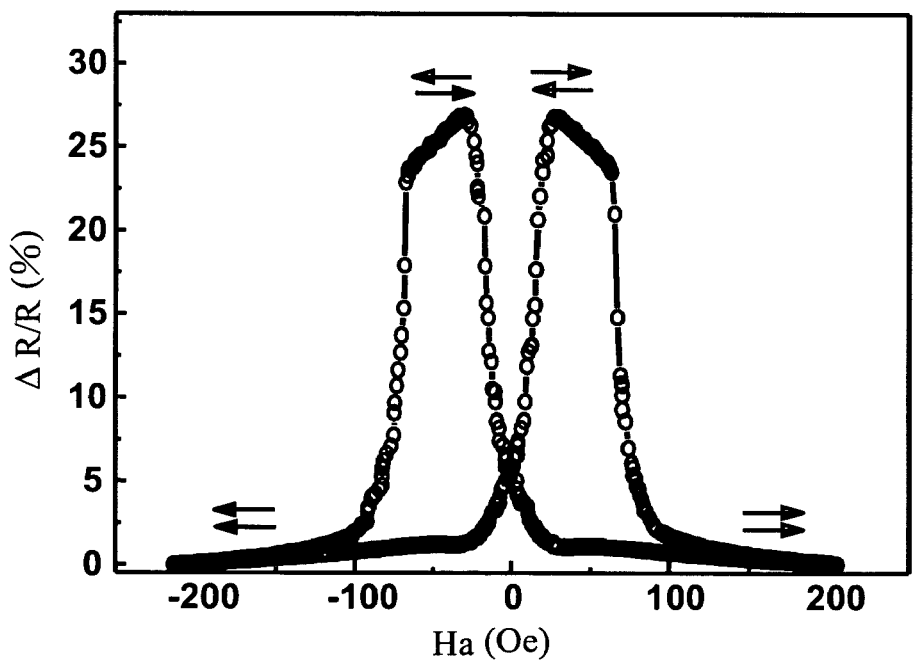
FIG. 9 is a schematic of MR response for the device in the applied magnetic field according to the invention.

On the other hand, as shown in FIG. 9, this MR device has TMR ratio of 27% in the applied field.

WORKING EXAMPLE

The optimum structures of MR devices are fabricated using by high vacuum and physical sputtering method. Ultra-thin insulating layer with high packing density and dielectric property is formed by a specialized oxidation method. Describe the process in brief: using a thin line of 180 um and a metal mask of Φ 1.8 mm to form a stacking pattern on a glass substrate, and sputtering NiFe, CoFe, AlO$_x$, and CoFe four stacking layers on the substrate. Then the MR and MI property were carried out by four-point probe method in the sweep field of ±200 Oe. The measurement results are shown in FIG. 6 to FIG. 9.

According to the description above, the invention can be applied to a detector in the micro magnetic filed, magnetic random access memory and other magnetic semiconductors indeed.

Although the invention has been described with reference to specific embodiments, this description is not meant to construe in a limiting sense. Various modifications of the disclosed embodiments as well as alternative embodiments will be apparent to persons skilled in the art. It is intended that the appended claims will cover all modifications that are within the true scope of the invention.

What is claimed is:

1. A tunneling magnetoresistance device with high magnetoimpedance effect, comprising:
   a first ferromagnetic layer;
   a second ferromagnetic layer; and
   a tunnel barrier layer which is located between the first ferromagnetic layer and the second ferromagnetic layer;
   Wherein an alternating current is applied to a tunneling magnetoresistance device, the tunneling magnetoresistance device has at least 100% variation of a real component between a first alternating frequency and a second alternating frequency, and at least 25% variation of an imaginary component below the first alternating frequency.

2. The device of claim 1, wherein the first alternating frequency is 1 KHz.

3. The device of claim 1, wherein the second alternating frequency is 10000 KHz.

4. The device of claim 1, wherein the variation of the imaginary component is higher than 40% between 0.005 KHz and 50 KHz in the alternating frequency.

5. The device of claim 1, wherein the second ferromagnetic layer has stronger coercive force than the first ferromagnetic layer.

6. The device of claim 1, wherein coercive force of the first ferromagnetic layer is smaller than 50 Oe.

7. The device of claim 1, wherein coercive force of the second ferromagnetic layer is higher than 25 Oe.

8. The device of claim 1, wherein a material of the first ferromagnetic layer is selected from one group consisted of Co, Fe, Ni, Gd, Ru, B or a combination with at least one of the above elements.

9. The device of claim 8, wherein a material of the preferred first ferromagnetic layer is selected from one group consisted of Co, Fe, Ni or a combination with at least one of the above elements.

10. The device of claim 1, wherein a material of the second ferromagnetic layer is selected from one group consisted of Co, Fe, Ni, Gd, Ru, B or a combination with at least one of the above elements.

11. The device of claim 10, wherein a material of the preferred second ferromagnetic layer is selected from one group consisted of Co, Fe, Ni or a combination with at least one of the above elements.

12. The device of claim 1, wherein a material of the tunnel barrier layer is selected from one group c consisted of a metal oxide, a metal nitride, a silicon oxide or a combination with at least one of the above compounds.

13. The device of claim 12, wherein the metal oxide is selected from one group consisting of a cobalt oxide, a iron oxide, a nickel oxide, a manganese oxide, a zinc oxide, a aluminum oxide, a lead oxide, a tantalum oxide, a magnesium oxide, a barium oxide, a zirconium oxide, a titanium oxide, a strontium oxide, a copper oxide, a chromium oxide, a lithium oxide, a tin oxide, a hafnium oxide or a combination with at least one of above compounds.

14. The device of claim 12, wherein the metal nitride is selected from one group consisting of a cobalt nitride, a iron nitride, a nickel nitride, a manganese nitride, a zinc nitride, a aluminum nitride, a lead nitride, a tantalum nitride, a magnesium nitride, a barium nitride, a zirconium nitride, a titanium nitride, a strontium nitride, a copper nitride, a chromium nitride, a lithium nitride, a tin nitride, a hafnium nitride or a combination with at least one of above compounds.

15. The device of claim 1, further comprising an antiferromagnetic layer which stacks with the second ferromagnetic layer to enhance magnetic moment of the second ferromagnetic layer.

16. The device of claim 15, wherein the second ferromagnetic layer has stronger coercive force than the antiferromagnetic layer.

17. The device of claim 15, wherein a material of the anti-ferromagnetic layer is selected from one group consisted of Co, Fe, Ni, Mn, Pt, Ir, Ru, Gd or a combination with at least one of the above elements.

18. The device of claim 17, wherein the preferred anti-ferromagnetic layer is selected from one group consisted of Co, Fe, Ni, Mn, Pt, Ir or a combination with at least one of the above elements.

19. The device of claim 1, further comprising a couple of electrodes which disposed on the outsides of the first ferromagnetic layer and the second ferromagnetic layer respectively to provide an alternating current.

20. The device of claim 1, comprising at least 8.5% variation of magnetocapacitance (MC) ratio which is generated along the magnetization direction.

* * * * *